(12) United States Patent
Pahl et al.

(10) Patent No.: US 9,278,854 B2
(45) Date of Patent: Mar. 8, 2016

(54) METHOD FOR PRODUCING A SENSOR

(71) Applicant: Epcos AG, München (DE)

(72) Inventors: Wolfgang Pahl, München (DE); Anton Leidl, Hohenbrunn (DE); Jürgen Portmann, München (DE); Robert Eichinger, Pullach (DE); Christian Siegel, München (DE); Karl Nicolaus, Zorneding (DE); Thomas Wassner, München (DE); Thomas Sedlmeier, Pfaffenhofen an der Ilm (DE)

(73) Assignee: Epcos AG, München (DE)

( * ) Notice: Subject to any disclaimer, the term of this patent is extended or adjusted under 35 U.S.C. 154(b) by 0 days.

(21) Appl. No.: 14/378,363

(22) PCT Filed: Feb. 8, 2013

(86) PCT No.: PCT/EP2013/052553
§ 371 (c)(1),
(2) Date: Aug. 13, 2014

(87) PCT Pub. No.: WO2013/124170
PCT Pub. Date: Aug. 29, 2013

(65) Prior Publication Data
US 2015/0056725 A1 Feb. 26, 2015

(30) Foreign Application Priority Data
Feb. 24, 2012 (DE) .................. 10 2012 101 505

(51) Int. Cl.
*B81C 1/00* (2006.01)
*B81C 99/00* (2010.01)
*H01L 21/66* (2006.01)
*H04R 31/00* (2006.01)

(52) U.S. Cl.
CPC ......... *B81C 1/00333* (2013.01); *B81C 99/0045* (2013.01); *H01L 22/12* (2013.01); *H04R 31/006* (2013.01); *H01L 2224/16225* (2013.01); *H01L 2924/1461* (2013.01)

(58) Field of Classification Search
None
See application file for complete search history.

(56) References Cited

U.S. PATENT DOCUMENTS

2009/0001553 A1    1/2009   Pahl et al.
2010/0167799 A1*   7/2010   Makihata et al. .......... 455/575.1

(Continued)

FOREIGN PATENT DOCUMENTS

DE    102008007682 A1   12/2008
DE    102008032319 A1    1/2010
DE    102010026519 A1    1/2012

(Continued)

OTHER PUBLICATIONS

International Search Report corresponding to co-pending International Patent Application Serial No. PCT/EP2013/052553, European Patent Office, dated Sep. 3, 2013; (2 pages).

Primary Examiner — Michael Jung
Assistant Examiner — Mikka Liu
(74) Attorney, Agent, or Firm — Nixon Peabody LLP (57) ABSTRACT

The present invention relates to a method for producing a sensor (SEN), comprising the steps of arranging a sensor element (SE) on a carrier (TR), arranging a cover (AF) on the sensor element (SE), wherein the sensor element (SE) is enclosed between the cover (AF) and the carrier (TR), adhesively bonding a carrier film (TF) onto the cover (AF), and producing an opening (SO) in the carrier film (TF) and the cover (AF), wherein the openings (SO) in the carrier film (TF) and the cover (AF) at least partly overlap.

18 Claims, 4 Drawing Sheets

(56) References Cited

U.S. PATENT DOCUMENTS

| | | |
|---|---|---|
| 2011/0018076 A1 | 1/2011 | Pahl et al. |
| 2012/0093346 A1 | 4/2012 | Feiertag et al. |
| 2012/0153771 A1* | 6/2012 | Formosa et al. ............. 310/300 |
| 2013/0140656 A1* | 6/2013 | Pahl et al. .................... 257/416 |
| 2014/0076052 A1* | 3/2014 | Doller et al. .................. 73/587 |

FOREIGN PATENT DOCUMENTS

| | | | |
|---|---|---|---|
| JP | 2007-039672 A | 2/2007 | |
| JP | 2008-054007 A | 3/2008 | |
| JP | 2011-097311 A | 5/2011 | |
| WO | 2012/004339 A1 | 1/2012 | |
| WO | WO 2012004339 A1 * | 1/2012 | ............... B81B 7/00 |

\* cited by examiner

METHOD FOR PRODUCING A SENSOR

CROSS-REFERENCE TO RELATED APPLICATIONS

This application is a U.S. National Stage of International Application No. PCT/EP2013/052553, filed Feb. 8, 2013, which claims the benefit of Germany Patent Application No. 10 2012 101 505.8, filed on Feb. 24, 2012, both of which are incorporated herein by reference in their entireties.

The present invention relates to a method for producing a sensor.

In particular, the invention relates to a method for producing an MEMS microphone, wherein a transducer element is enclosed between a carrier and a cover. The transducer element can convert acoustic signals, which enter through a sound entrance opening, into electrical signals.

With regard to the sensitivity of a sensor, requirements are often made which demand an opening in the sensor at a specific location. By way of example, in the case of an MEMS microphone, specific acoustics may be desired, the attainment of which necessitates the arrangement of the sound entrance opening at a specific location. This requirement leads to complex manufacture and complicated functional tests.

It is therefore an object of the present invention to specify a method for producing a sensor which makes it possible to produce an opening in the sensor in a simple manner.

This object is achieved by means of a method according to claim 1. Advantageous configurations can be gathered from the further claims.

A method for producing a sensor is proposed, comprising the following steps:
arranging a sensor element on a carrier,
arranging a cover on the sensor element, wherein the sensor element is enclosed between the cover and the carrier,
adhesively bonding a carrier film onto the cover, and
producing an opening in the carrier film and the cover, wherein the openings in the carrier film and the cover at least partly overlap.

Opening here denotes a perforation in the housing or in the cover of the sensor through which the otherwise encapsulated sensor element communicates with the environment. Depending on the underlying type of sensor, a corresponding access is provided, for example for sound waves in the case of a microphone, for air pressure in the case of a pressure sensor, or air exchange in the case of sensors for air humidity, sensors for determining gas compositions or sensors for determining biochemical parameters.

The cover of the sensor can be composed of a plurality of layers. By way of example, the cover can be formed by a covering film composed of plastic. Furthermore, the cover can comprise a metalization layer, for example a base metalization and a reinforcement layer.

The adhesive bonding of the sensor on the carrier film makes it possible to perform driving of the sensor element via the openings in the carrier film and the cover. By way of example, for a functional test of a microphone, sound can be fed in via this opening. Furthermore, the sensor can be moved by a movement of the carrier film.

Accordingly, the carrier film can make it possible to deliver the sensor to a test apparatus.

In one exemplary embodiment, the opening in the carrier film and the cover is produced after the process of adhesively bonding the carrier film. In particular, the openings in the carrier film and in the cover can be produced in a common method step. By way of example, the opening in the carrier film and in the cover can be produced by drilling, in particular laser drilling. After the opening has been produced, the sensor does not have to be transferred by adhesive bonding onto a different film; instead, the entire carrier film can be displaced.

Accordingly, the method is distinguished by particularly simple handling of the sensors in a confined space with little consumption of auxiliary materials.

In one exemplary embodiment, the openings in the carrier film and the cover are congruent. Congruent openings arise particularly if the openings in the carrier film and in the cover are produced in a common method step, e.g. by laser drilling.

In an alternative method, respective openings in the carrier film and in the cover are produced before the process of adhesively bonding the carrier film. Furthermore, in this case, the sensor element is positioned during the adhesive-bonding process in such a way that the openings in the carrier film and the cover at least partly overlap.

The sensors are thus placed onto a pre-perforated carrier film with openings already present. It is conceivable, for example, that the sensors are produced and an opening is produced, but the sensors are subsequently stored without being used for a relatively long time. At a later point in time, the functionality of the sensors is intended to be checked. The sensors are then adhesively bonded onto a carrier film that is already pre-perforated with openings. In this way, the carrier film can be used to deliver the sensor elements to a test apparatus.

Preferably, in the method, a multiplicity of sensor elements are arranged on a carrier substrate, and a cover is arranged on the sensor element in such a way that the sensor elements are enclosed in each case between the carrier substrate and the cover. Furthermore, a carrier film can be adhesively bonded onto the cover, and the sensor elements can be singulated after the process of adhesively bonding the carrier film.

This method makes it possible to avoid complex handling of individual components. Instead, a common carrier substrate, which can have a few thousand components, for example, is handled in a direct assemblage over a large number of manufacturing steps. The direct assemblage of the sensor elements is distinguished by the fact that the sensor elements are fixedly connected to one another, for instance because they are arranged on a common carrier substrate.

After the adhesive bonding on the carrier film and the singulation, the sensors can still be held in an indirect assemblage with respect to one another by means of the carrier film, such that even after the singulation it is possible to carry out method steps wherein a multiplicity of sensors are handled simultaneously. Particularly the production of the sensor opening and the functional testing of the sensors can be carried out in the indirect assemblage, wherein, as a result of the adhesive bonding onto the carrier film, the individual sensors remain aligned relative to one another.

The indirect assemblage of the sensor elements is distinguished by the fact that the sensor elements are arranged on a common carrier film and, consequently, cannot move completely freely. However, the sensor elements are not aligned with one another as rigidly as in the direct assemblage. By way of example, relatively small displacements of individual sensor elements are possible.

As a result of the handling of a multiplicity of sensors jointly in the indirect assemblage in the method steps "producing the opening" and "functional test", the production costs can be considerably reduced. During singulation, wherein the sensors remain adhesively bonded on the carrier film, the sensors can possibly be displaced slightly. However, this displacement can be identified by a detection method and thus compensated for. In particular, automatic image recognition is suitable here as a detection method.

Preferably, the carrier film is removed in a further method step. For this purpose, the sensors can be picked up from the carrier film by means of a placement machine and placed directly at their intended location, for example onto a printed circuit board or into a packaging.

During the production method, the carrier film performs important tasks, such as, for instance, keeping the individual sensors aligned with one another in the indirect assemblage. Furthermore, the carrier film can serve as a sealing device between the sensor and a test apparatus. A test apparatus for sensors often has a coupling element which produces a direct connection to the sensor. The test apparatus can have, for example, an annular bead or an annular sheath as coupling element. In order to avoid damage to the sensor and in order to achieve a coupling that is as airtight as possible, the carrier film can be used as a seal between the coupling element and the opening in the sensor. In this case, for instance, the coupling element of the test apparatus can be manufactured from a wear-free material and the wear can be transferred to the only temporary carrier film. The test apparatus can have, for example, an annular bead comprising metal or an annular sheath as coupling element.

In one exemplary embodiment, the opening in the carrier film and the cover is produced by drilling. In particular, the opening can be produced by laser drilling. A source operating in the UV, e.g. having a wavelength of 365 nm, is particularly suitable as the laser. With the use of a temporary carrier film of the UV release type, it is also possible to use a YAG laser, for example having the wavelength of 1064 nm, or a $CO_2$ laser having a wavelength of 10.6 μm.

In one exemplary embodiment, the cover has a layer thickness which, in the region of the opening to be produced, is already thinner than in a different region when the cover is applied, or which is subsequently reduced in this region. The cover in the region of the opening to be produced is removed again later in a further method step. Therefore, it is advantageous to make the cover thinner in this region, in order thus to facilitate the removal of the cover in this region.

A thinner configuration of a cover comprising a metal layer in this region can be achieved for example with the aid of a resist structure. Accordingly, firstly, a base metalization can be applied above the sensor element. Afterward, a resist structure is applied in the region of the opening to be produced, and a metallic reinforcement layer is produced above the base metalization, wherein that region of the base metalization which is covered by the resist structure remains free of the reinforcement layer. The resist structure can then be removed. Alternatively, the resist structure remains on the base metalization. The resist structure can be applied by printing or jetting, for example. In a preferred process, the resist structure is produced by photolithography, for example by laser direct exposure of a laminated light-sensitive film.

In one exemplary embodiment, the thinner region of the cover can be identified in a detection method and can be used for determining the position at which the opening is produced. In particular, the resist structure or the contour of the thin location produced can be used in the detection method mentioned above. The detection method can be, for example, automatic image recognition. In this case, the resist structure and/or the contour of the thin location are used as alignment marks and the position of the sensors can be calculated by means of said alignment marks. On the basis of the data determined in this image recognition, the laser is aligned for producing the drilled hole. If the resist structure has not been removed previously, then it is wholly or partly removed by the drilling.

The image recognition takes place here through the carrier film. Therefore, it is all the more important that the sensors have a readily identifiable alignment mark, since the carrier film could possibly make the image recognition more difficult.

The method described here is suitable both for sensors having means for electrical contact-making on an opposite side relative to the carrier film, and for sensors in which the means for electrical contact-making are arranged on the same side as the carrier film. In the second case, the carrier film can be pierced and e.g. perforated by the means for electrical contact-making or by a contact-making needle of a test apparatus or can be removed in the regions in which the means for electrical contact-making are arranged. By way of example, the means for electrical contact-making can be exposed with the aid of a laser. Accordingly, the method is particularly advantageous since a uniform production method can be used for a multiplicity of different sensors.

The sensor element can be, in particular, a transducer element that converts sound waves into electrical signals. Accordingly, the sensor is a microphone, in particular an MEMS microphone.

However, the sensor element can also be a pressure sensor element, a gas sensor element, a moisture sensor element or a biochemical sensor element.

The sensor opening can have a plurality of smaller individual openings. As a result, effective particle protection can be achieved, for example, since particles having a diameter that is greater than the diameter of the individual openings cannot penetrate into the interior of the sensor. Furthermore, a plurality of individual openings also make it possible to set a desired directional characteristic or a frequency response in the case of microphones. In the case of differential pressure sensors, separate feeds via different openings are possible. A plurality of individual openings enable improved media flow circulation in the case of gas and moisture sensors.

The singulation can be performed at any desired stage in the process flow. Advantageously, however, it is preferably carried out before the functional testing, in order then to be able to identify faults in the separating process, i.e. in the singulation, in the functional testing. If the singulation is carried out before an opening is drilled, then it is possible to prevent sawing fluid or dust from penetrating into the interior of the sensor.

The invention is explained in greater detail below on the basis of exemplary embodiments and the associated figures. In this case, the figures have been drawn up only schematically and not as true to scale, so neither absolute nor relative dimensional indications can be inferred from the figures.

Figure 1A:
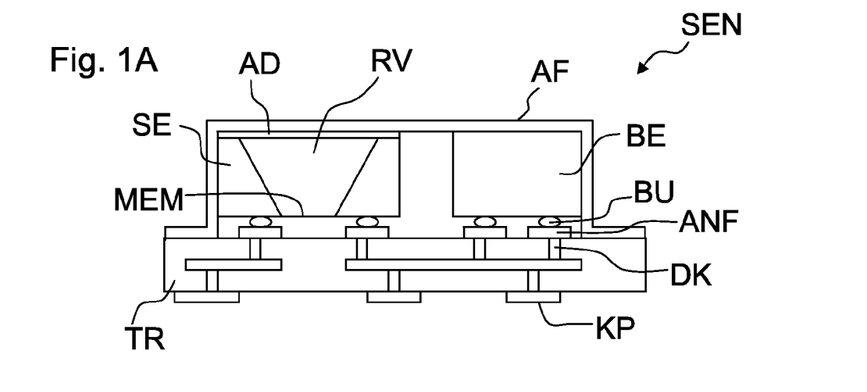
FIGS. 1A to 1G show different method stages in the production of a sensor.

FIGS. 1A to 1G show different method stages in the production of a sensor SEN. FIG. 1A shows a sensor SEN after the mounting of a sensor element SE and an optional further component BE on a carrier TR. The method shown in FIGS. 1A to 1F is also suitable for producing sensors SEN of any desired type of sensor, for example for sensors for pressure measurement, sensors for measuring the air humidity, sensors for determining gas compositions or other biochemical parameters.

In the example shown here, the sensor SEN is an MEMS microphone. The sensor element SE is a transducer element that converts sound waves into electrical signals. The transducer element has a membrane MEM and a back volume RV. The back volume RV is delimited by a first cover AD, which is applied at the wafer level. The first cover AD is a film.

A covering film AF is applied above the sensor element SE and the further component BE, wherein the covering film AF with the carrier TR provides closing-off sealing laterally all around. The covering film AF can comprise plastic, for example.

The sensor element SE is electrically contact-connected to the carrier TR via bumps BU. The carrier TR has connection areas ANF on its side facing the sensor element SE. On the side facing away from the sensor element SE, the carrier TR has contact pads KP. The contact pads KP and the connection areas ANF are connected to one another via plated-through holes DK. The contact pads KP serve for making electrical contact with the sensor SEN. Configurations are also conceivable in which the contact pads KP for electrical contact-making are arranged on the same side of the carrier TR as the sensor element SE and the further component BE.

The further component BE is also mounted on the carrier TR by means of bumps BU using flip-chip technology. The further component BE can be, for example, a circuit element that processes further and evaluates the data picked up by the sensor element SE.

Figure 1B:
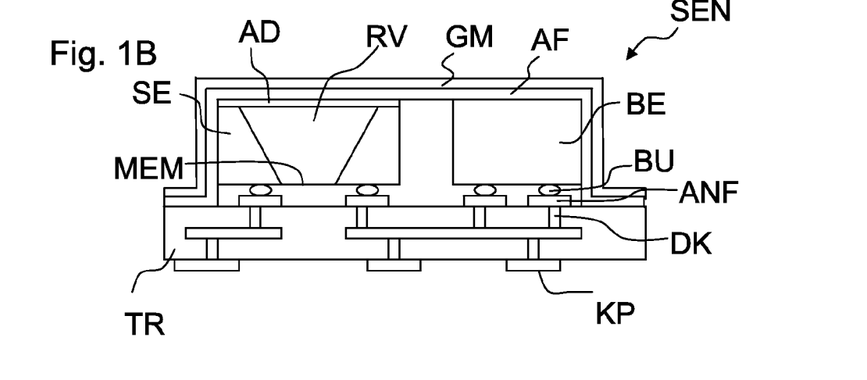

FIG. 1B shows the sensor SEN after a further method step. A base metalization GM is applied over the whole area, on the covering film AF, for example by plasma deposition or by sputtering. For this purpose, use is made of a metal such as e.g. Ti or a mixture or a layer sequence of metals which firstly ensure good adhesion on the covering film AF and secondly are well suited as a growth layer for later electrolytic reinforcement of the base metalization GM.

Figure 1C:
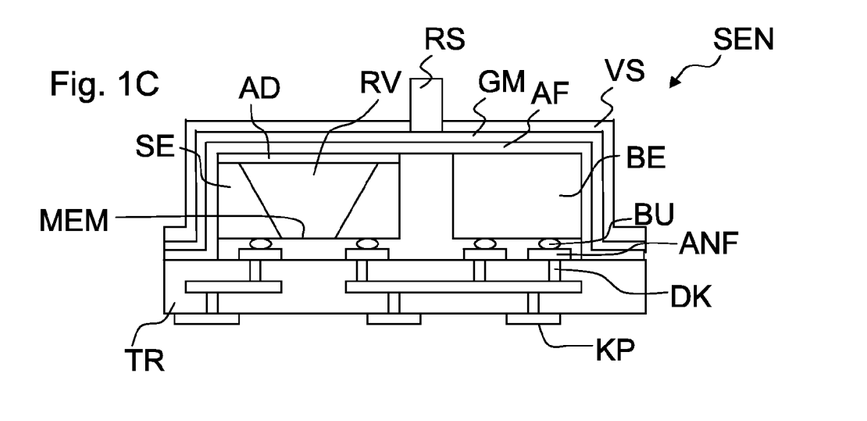

FIG. 1C shows the sensor SEN after the next step. The base metalization GM is electrolytically reinforced. Preferably, the reinforcement is performed in such a way that an opening SO is preformed, e.g. by an area provided for an opening SO being excluded from the electrolytic reinforcement. For this purpose, it is possible to produce a resist structure RS in the region of the later opening SO on the base metalization GM, for example by patterning a photoresist layer. The opening SO is a sound entrance opening. The resist structure RS can be applied by printing or jetting, for example, but in one preferred process by photolithography, for example by laser direct exposure on a laminated light-sensitive film.

Figure 1D:
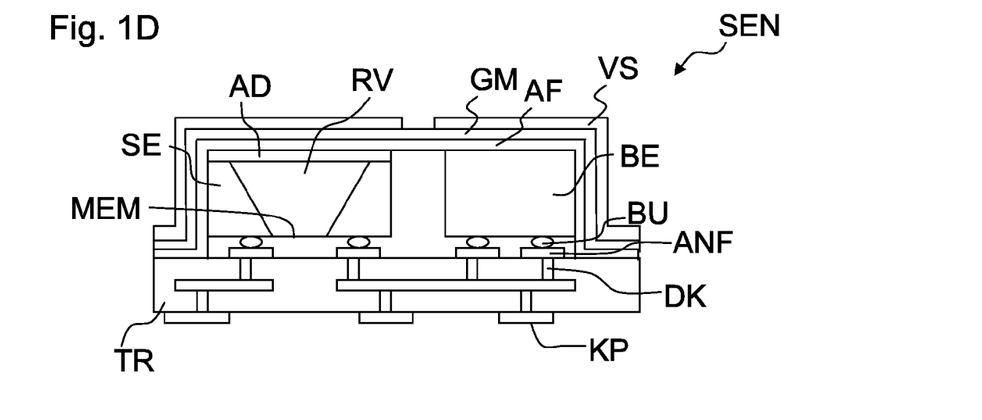

The reinforcement of the base metalization GM can be effected for example in an electroless fashion or by electrolytic deposition of copper as a conductive layer and of a further layer as an anticorrosion protective layer, wherein the conductive layer and the further layer together form a reinforcer layer VS. By way of example, approximately 50 µm of Cu and a few µm of nickel are successively produced electrolytically above the base metalization GM. FIG. 1D shows the arrangement after the electrolytic deposition of the reinforcer layer VS and after the removal of the resist structure RS. After the removal of the resist structure RS, an opening in the reinforcer layer VS is situated where the resist structure RS prevented an electrolytic reinforcement of the base metalization GM.

Figure 1E:
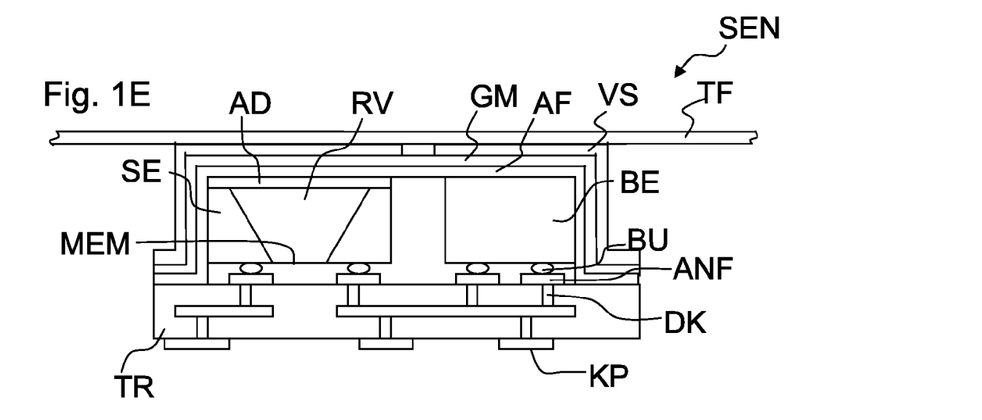

FIG. 1E shows the arrangement after a further method step. In this case, the sensor SEN is adhesively bonded onto a carrier film TF. In particular, that side of the sensor SEN which faces away from the carrier TR is adhesively bonded onto the carrier film TF.

The above-described manufacturing steps of the arrangement including the adhesive bonding of the sensor SEN onto the carrier film TF can be effected with a direct assemblage of numerous sensor elements on a common carrier substrate. In this case, on the common carrier substrate, which has several hundred to a few thousand sensor elements SE and further components BE, the sensor elements SE and the further components BE are handled in the direct assemblage over the largest possible number of manufacturing steps. After adhesive bonding onto the carrier film TF, the sensor elements SE and the further components BE can be singulated. The singulation can be effected by sawing, for example.

By virtue of the taut carrier film TF, the singulated sensor elements SE and further components BE remain arranged in an indirect assemblage with respect to one another. Accordingly, even after the singulation, a plurality of sensor elements SE and further components BE can be handled jointly.

Figure 1F:
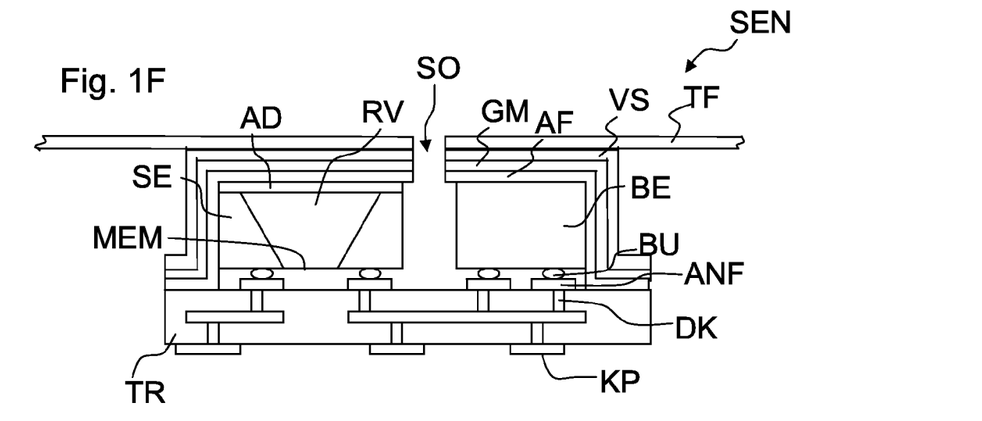

FIG. 1F shows the sensor SEN after the production of an opening SO through the carrier film TF, the base metalization GM and the covering film AF. The opening SO can be produced for example by drilling, in particular laser drilling. In this case, only the relatively thin base metalization GM, the covering film AF, which preferably consists of plastic, and the carrier film TF have to be pierced. This is accomplished with relatively low intensities and in a controlled manner, such that damage to components of the sensor element SE that are located below the opening SO can be successfully prevented. By way of example, $CO_2$, YAG or UV lasers are suitable for opening the base metalization GM in the region of the opening SO.

The contour of the previously produced thin location can be used in a detection method for determining the positioning of the drilled hole. The detection method can be automatic image recognition, for example. In an alternative method, the resist structure RS, before it is removed, is used for the above-mentioned detection method for determining the positioning of the drilled hole.

Figure 1G:
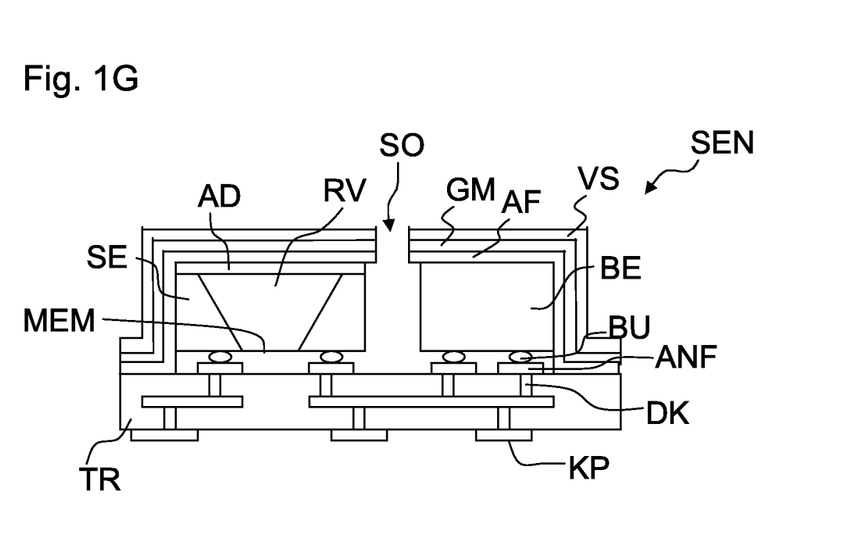

After the opening SO has been produced, a functional test of the sensor SEN can be carried out. The carrier film TF is then removed. FIG. 1G shows the sensor SEN after the removal of the carrier film TF. FIG. 1G thus shows the sensor SEN after the end of the production method.

The method alternatively makes it possible to arrange both the opening SO of the sensor SEN and the electrical contacts KP of the carrier TR on that side of the carrier TR which is covered by the carrier film TF. In this case, the electrical contacts KP required for the functional testing can be exposed with the aid of the laser.

The singulation could also be performed in a different method stage. However, if the singulation is performed before the functional testing, then faults which arise during the singulation can be identified in the functional testing. If the singulation is carried out before the opening SO is drilled, then sawing fluids or dust arising during the singulation can be prevented from being able to pass into the interior of the sensor SEN through the opening SO.

Figure 2:
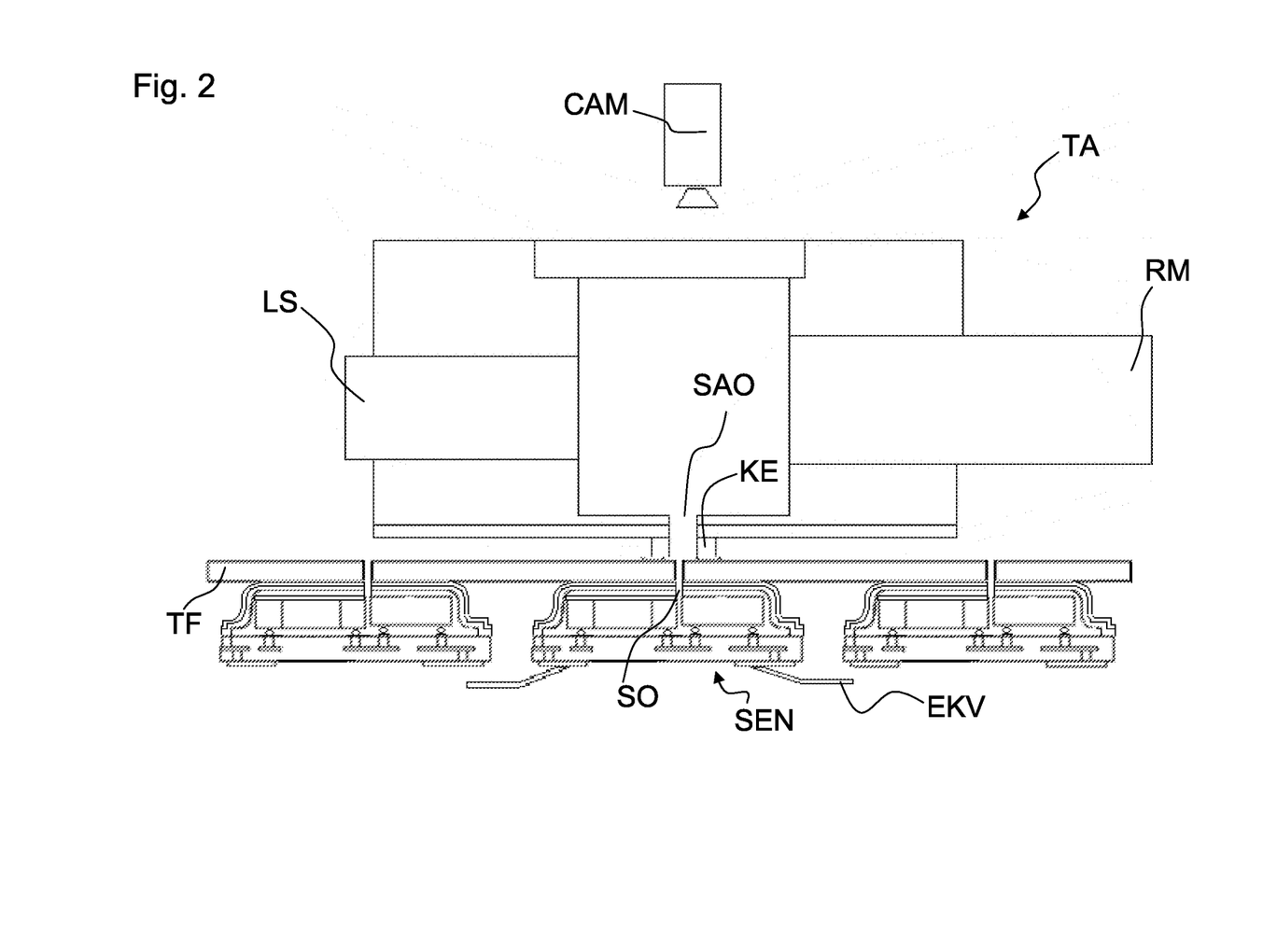
FIG. 2 shows a functional test of a multiplicity of sensors.

FIG. 2 shows a test method by which the manufactured sensors SEN are tested with regard to their functionality. The test method shown here is carried out after the singulation and before the removal of the sensors SEN from the carrier film TF. The carrier film TF connects the sensors SEN to form an indirect assemblage. A test apparatus TA having a loudspeaker LS, a sound exit opening SAO and a reference microphone RM is used for the functional test.

The test apparatus TA is aligned above the opening SO in the sensor SEN to be tested in such a way that the sound exit opening SAO of the test apparatus TA and the opening SO in the sensor SEN lie one above the other. A camera CAM can be used for fine alignment. The sound exit opening SAO and the opening SO in the sensor SEN are acoustically coupled to one another. The sensor SEN is aligned with the test apparatus TA by a relative movement between the carrier film TF and the test apparatus TA.

Furthermore, the test apparatus TA has an electrical contact device EKV, which enables electrical contact to be made with the sensor. A plurality of sensors SEN can be tested successively by means of a relative movement of the test apparatus TA and the sensors SEN arranged on the carrier film TF with respect to one another.

Furthermore, the test apparatus TA has a sealing structure, which forms a coupling element KE for acoustically coupling the sensor SEN to the test apparatus TA. The sealing structure encloses the sound exit opening SO of the test apparatus TA. The coupling element KE is composed of a wear-free material, for example metal. The carrier film TF seals the transition between the coupling element KE and the opening SO in the sensor SEN. Since the carrier film TF is manufactured from a soft material which exhibits wear abrasion under friction, the sensor SEN and the coupling element KE are protected against wear in this way.

Alternatively, the functional test can also be carried out in such a way that a gap remains free between the sound exit opening SAO and the opening SO in the sensor SO, such that test apparatus TA and sensor SO do not form a closed system.

LIST OF REFERENCE SIGNS

SEN—Sensor
SE—Sensor element
BE—Further component
TR—Carrier
MEM—Membrane
RV—Back volume
AD—Cover
AF—Covering film
BU—Bump
ANF—Connection area
KP—Contact pad
DK—Plated-through hole
GM—Base metalization
SO—Opening
RS—Resist structure
VS—Reinforcer layer
TF—Carrier film
TA—Test apparatus
LS—Loudspeaker
SAO—Sound exit opening
RM—Reference microphone
CAM—Camera
EKV—Electrical contact device
KE—Coupling element

The invention claimed is:
1. A method for producing a sensor, comprising the following steps of:
arranging a sensor element on a carrier,
arranging a cover on the sensor element, wherein the sensor element is enclosed between the cover and the carrier,
adhesively bonding a carrier film onto the cover,
producing an opening in the carrier film and the cover, wherein the openings in the carrier film and the cover at least partly overlap, and
removing the carrier film by picking up the sensor element from the carrier film.

2. The method according to claim 1,
wherein the opening in the carrier film and the cover is produced after the process of adhesively bonding the carrier film.
3. The method according to claim 1,
wherein the openings in the carrier film and in the cover are produced in a common method step.
4. The method according to claim 1,
wherein the openings in the carrier film and the cover are congruent.
5. The method according to claim 1,
wherein the openings in the carrier film and in the cover are produced before the process of adhesively bonding the carrier film, and
wherein the sensor element is positioned during the adhesive bonding process in such a way that the openings in the carrier film and the cover at least partly overlap.
6. The method according to claim 1,
wherein the sensor element is a multiplicity of sensor elements arranged on a carrier substrate, and
wherein the cover is arranged on the sensor elements in such a way that the sensor elements are enclosed in each case between the carrier substrate and the cover,
wherein the carrier film is adhesively bonded onto the cover, and
wherein the sensor elements are singulated after the adhesive bonding process.
7. The method according to claim 1,
wherein a functional test of the sensor is carried out by means of a test apparatus before the carrier film is removed, wherein the sensor is aligned relative to the test apparatus by a relative movement of the carrier film and the test apparatus.
8. The method according to claim 7,
wherein the carrier film forms a seal between the sensor and the test apparatus during the functional test.
9. The method according to claim 1,
wherein the opening in the carrier film and the cover is produced by drilling.
10. The method according to claim 1,
wherein the cover has a layer thickness which, in a region of the opening to be produced, is already thinner than in a different region when the cover is applied, or which is subsequently reduced in this region.
11. The method according to claim 9,
wherein a base metalization is applied above the sensor element,
wherein a resist structure is applied in a region of the opening to be produced,
wherein a reinforcement layer is produced above the base metalization, wherein a region of the base metalization which is covered by the resist structure remains free of the reinforcement layer.
12. The method according to claim 10,
wherein the thinner region of the cover is identified in a detection method and is used for determining a position at which the opening is produced.
13. The method according to claim 1,
wherein the sensor includes a contact pad on a surface of another structure in the sensor facing away from the carrier film.
14. The method according to claim 1,
wherein the sensor includes a contact pad arranged on a surface of another structure in the sensor facing the carrier film.

15. The method according to claim 14,
wherein the carrier film is perforated by the contact pad or by a test apparatus, or wherein the carrier film is removed in regions in which the contact pad is arranged.

16. The method according to claim 1,
wherein the sensor element is a transducer element that converts sound waves into electrical signal.

17. The method according to claim 11,
wherein a thinner region of the cover is identified in a detection method and is used for determining a position at which the opening is produced.

18. A method for producing a sensor, comprising the following steps of:
arranging a sensor element on a carrier,
arranging a cover on the sensor element, wherein the sensor element is enclosed between the cover and the carrier,
adhesively bonding a carrier film onto the cover, and producing an opening in the carrier film and the cover, wherein the openings in the carrier film and the cover at least partly overlap, wherein the carrier film is removed in a further step, and wherein a functional test of the sensor is carried out by means of a test apparatus before the carrier film is removed, wherein the sensor is aligned relative to the test apparatus by a relative movement of the carrier film and the test apparatus.

* * * * *